United States Patent [19]
Akaogi et al.

[11] Patent Number: 5,770,963
[45] Date of Patent: Jun. 23, 1998

[54] FLASH MEMORY WITH IMPROVED ERASABILITY AND ITS CIRCUITRY

[75] Inventors: Takao Akaogi; Hiromi Kawashima; Tetsuji Takeguchi; Ryoji Hagiwara; Yasushi Kasa; Kiyoshi Itano, all of Kawasaki; Yasushige Ogawa, Kasugai; Shouichi Kawamura, Kawasaki, all of Japan

[73] Assignee: Fujitsu Limited, Kanagawa, Japan

[21] Appl. No.: 436,699

[22] Filed: May 8, 1995

Related U.S. Application Data

[62] Division of Ser. No. 98,406, Aug. 6, 1993, abandoned.

[30] Foreign Application Priority Data

| Dec. 9, 1991 | [JP] | Japan | 3-324701 |
| Dec. 27, 1991 | [JP] | Japan | 3-346571 |
| Jan. 14, 1992 | [JP] | Japan | 4-4678 |
| Mar. 19, 1992 | [JP] | Japan | 4-64143 |
| Jun. 5, 1992 | [JP] | Japan | 4-145300 |
| Jun. 15, 1992 | [JP] | Japan | 4-154958 |
| Sep. 25, 1992 | [JP] | Japan | 4-256594 |
| Nov. 10, 1992 | [JP] | Japan | 4-299987 |

[51] Int. Cl.$^6$ .................................................. H03K 5/08
[52] U.S. Cl. .................... 327/309; 327/534; 365/185.27; 365/185.29
[58] Field of Search ............................. 365/185, 189.09, 365/185.18, 185.27, 185.29; 327/536, 534, 309, 564

[56] References Cited

U.S. PATENT DOCUMENTS

| 4,438,346 | 3/1984 | Chuang et al. | 327/536 |
| 4,920,280 | 4/1990 | Cho et al. | 327/536 |
| 5,029,282 | 7/1991 | Ito | 327/536 |
| 5,180,928 | 1/1993 | Choi | 327/536 |
| 5,200,919 | 4/1993 | Kaya | 365/185 |
| 5,235,544 | 8/1993 | Caywood | 365/185 |
| 5,251,169 | 10/1993 | Josephson | 365/185 |
| 5,341,342 | 8/1994 | Brahmbhatt | 365/185.27 |
| 5,379,253 | 1/1995 | Bergemont | 365/185.27 |
| 5,406,524 | 4/1995 | Kawamura et al. | 365/185.27 |
| 5,416,738 | 5/1995 | Shrivastaba | 365/185.27 |
| 5,438,542 | 8/1995 | Atsumi et al. | 365/185.27 |
| 5,557,565 | 9/1996 | Kaya et al. | 365/185.27 |

FOREIGN PATENT DOCUMENTS

| 49-126249 | 12/1974 | Japan . |
| 50-140255 | 11/1975 | Japan . |
| 60-211699 | 10/1985 | Japan . |
| 60-229300 | 11/1985 | Japan . |
| 61-186019 | 8/1986 | Japan . |
| 1-273357 | 11/1989 | Japan . |
| 2-71499 | 3/1990 | Japan . |
| 3-203097 | 9/1991 | Japan . |

*Primary Examiner*—Timothy P. Callahan
*Assistant Examiner*—Jung Ho Kim
*Attorney, Agent, or Firm*—Nikaido, Marmelstein, Murray & Oram LLP

[57] ABSTRACT

A flash memory performs channel erasing or source erasing by applying a negative voltage to a control gate. The device includes a voltage restriction device which restricts the negative voltage to be applied to the control gate so that the negative voltage will be a constant value relative to the voltage of the channel or source. Alternatively, two voltage restricting devices restrict the negative voltage applied to the control gate and the voltage to be applied to the source so that the voltages will be a constant value relative to a common reference voltage.

2 Claims, 12 Drawing Sheets

FOR WRITING

FOR READING

FOR ERASING
(POSITIVE-VOLTAGE
APPLICATION)

FOR ERASING
(NEGATIVE-VOLTAGE
APPLICATION)

FLASH MEMORY WITH IMPROVED ERASABILITY AND ITS CIRCUITRY

This is a division, of application Ser. No. 08/098,406 filed Aug. 6, 1993, abandoned.

TECHNICAL FIELD

The present invention relates to a so-called flash memory or a nonvolatile semiconductor memory from which existent information can be electrically erased concurrently or block by block. In particular, this invention is concerned with improvements in erasing a flash memory and improvements in the associated circuitry.

In recent years, a variety of semiconductor memories such as an electrically erasable programmable read only memory (EEPROM), which can be rewritten by electrically erasing data stored therein, have been developed in the field of nonvolatile memories.

The semiconductor memories are nonvolatile memories which are made rewritable by electrically erasing specified data previously written therein.

As for this kind of nonvolatile memory, in consideration of the use as a substitute for a magnetic storage or the like, efforts have been made to increase the capacity and decrease the cost. For use in a portable information processing terminal or the like, however, it is required to lower the voltage requirements.

Known semiconductor memories, which are nonvolatile memories that are made rewritable by erasing specified data previously written therein, include an erasable programmable read only memory (EPROM) and the EEPROM.

The EPROM has the advantage of a small cell size. However, data erasing is a nuisance because ultraviolet light must be used to erase data. As for the EEPROM, data erasing is easy to do because data can be erased electrically. However, the cell size in the EEPROM is larger than that in the EPROM, which makes it difficult to increase the capacity of an EEPROM.

As a semiconductor memory having the advantages of the foregoing memories, for example, what is referred to as a flash memory has been developed.

The term "flash memory" will be adopted in the succeeding description.

BACKGROUND ART

The nonvolatile semiconductor memory has an overall configuration, for example, as that shown in FIG. 1. In FIG. 1, N cell blocks $11_1$ to $11_N$ (for example, eight blocks) each having multiple transistor cells are arranged in a row. The cell blocks $11_1$ to $11_N$ are provided with bit line select circuits $12_1$ to $12_N$ and sense amplifiers/sense buffers $13_1$ to $13_N$ respectively.

A row address signal is supplied from a row address buffer 14 to each of the cell blocks $11_1$ to $11_N$ via a row decoder 15. A column address signal is supplied from a column address buffer 16 to each of the bit line select circuits $12_1$ to $12_N$ via a column address decoder 17. A voltage $V_S$ sent from a source power supply circuit 18 is applied to each of source electrodes of the transistor cells of the cell blocks $11_1$ to $11_N$.

FIG. 2 shows the cell block 11, one of the cells blocks in the aforesaid nonvolatile semiconductor memory, and its peripheral circuitry. In FIG. 2, components identical to those in FIG. 1 bear the same reference numerals, of which a description will be omitted. In FIG. 2, the bit line select circuit 12 comprises n-channel MOS field-effect transistors Q1 to Qn. Column address signals Y1 to Yn are fed from the column decoder 17 to the gates of the transistors Q1 to Qn.

The cell block 11 comprises a total of n by n field-effect transistors Q11 to Qnn having floating gates and control gates. The gates of n transistors Qi1 to Qin (where, i=1, 2, etc., and n) arranged in tandem are provided with row address signals Xi sent from the row decoder 15 via word lines.

The drains of the n transistors Qli to Qni arranged in tandem are connected to the drains of the transistors Qi in the bit line select circuit 12 via bit lines. Voltage from the source power circuit 18 is applied to each of the sources of the transistors Q11 to Qnn. A cell amplifier 13a and a write buffer 13b are connected to each of the sources of the transistors Q1 to Qn.

In the foregoing semiconductor memory, when row addresses Xi and column addresses Yi are selected for writing, data read from the write buffer 13 are written in the transistors Qij of the cell blocks $11_1$ to $11_N$. Writing is performed simultaneously on one bit per each of the cell blocks $11_1$ to $11_N$ or a total of N bits designated with the row addresses and column addresses. Data erasing is performed concurrently on all transistors in the cell blocks $11_1$ to $11_N$.

In a flash memory, information is retained depending on the presence or absence of a charge in a memory cell. FIG. 3 shows an example of a structure of a memory cell. As shown in FIG. 3, a gate has a two-layered structure consisting of a control gate (CG) 25 and a floating gate (FG) 24. The control gate 25 is connected to a word line WLi and a drain (D) 23 is connected to a bit line BLi. Reference numeral 26 denotes a tunneling oxide film.

The flash memory is broadly divided into two types of what are referred to as NOR and NAND. These types differ from each other in a method of writing, reading, or erasing information into or from a memory cell. Taking the NOR type flash memory as an example, writing, reading, or erasing information into or from a memory cell will be described below.

When information is to be written in a memory cell having the aforesaid structure, as shown in FIG. 4, the word line WLi is set to Vpp (approx. 12 V), the bit line BLi is set to approx. 6 V, and the source S is set to 0 V. High voltage is then applied to the control gate CG and drain D. Current then flows into the memory cell. Part of the electrons flowing through the memory cell are accelerated due to the high electric field in the vicinity of the drain D, gain energy, and then goes beyond the energy barrier of an insulating film of the floating gate. The electrons are finally injected into the floating gate FG. The floating gate FG is not electrically coupled with other circuits, so it therefore can retain charges on a semi-permanent basis.

When information is to be read from a memory cell, as shown in FIG. 5, the word line WLi is set to Vcc (about 5 V), the bit line BLi is set to about 1 V, and the source S is set to 0 V. The memory cell is then selected by specifying the word line WLi and bit line BLi. The threshold value of the cell transistor varies depending on the charges retained in the floating gate FG. Current flowing through the selected memory cell varies depending on the information stored therein. The information therefore can be read out by detecting and amplifying the current.

The voltage levels of the control gate CG, drain D, source S, and substrate PS in the aforesaid operative states are set to the values listed in Table 1.

TABLE 1

Voltages in modes in a prior art

|  | CG | D | S | PS |
|---|---|---|---|---|
| Reading | Vcc | to 1 V | 0 V | 0 V |
| Writing | Vpp | to 6 V | 0 V | 0 V |
| Erasing | 0 V | Float | Vpp | 0 V |

When information is to be erased from a memory cell, as shown in FIG. 6, the word line WLi is set to about 0 V and the bit line BLi is opened. In this state, the drain D is opened, about 0 volt is applied to the control gate CG, and a high voltage of about 12 volts is applied to the source S.

Since a high voltage is applied to the source S, deep diffusion is required in order to increase the resistivity of the diffused layer in the source. This hinders reduction in cell area.

For divided erasing, it is required that the Vss line in the source must partly have a different voltage. This leads to disconnection or an increased number of drive circuits. Eventually, chip size increases.

A solution to the above problem is to apply a negative voltage to the word line WLi. To be more specific, as shown in FIG. 7, a negative voltage (about −10 V) is applied to the control gate CG and Vcc (about 5 V) is applied to the source S. The drain D is opened. Erasing is then executed.

In this case, since a low voltage is applied to the source S, the resistivity of the source need not be intensified. This contributes to reduction in cell size. Partial erasing is enabled by selectively applying negative voltage to the control gates CG.

The aforesaid erasing method is a source erasing method in which charges in the floating gate FG are routed to the source. A channel erasing method is also available, wherein charges in the floating gate are routed to a channel; that is, a substrate. Even in this method, negative voltage is applied to the control gate. The channel erasing method is sometimes employed for the aforesaid NAND-type flash memory.

FIGS. 8 to 11 show the states of a memory cell with voltage applied according to various erasing methods. In FIGS. 8 to 11, the memory cell is an n-channel transistor.

FIG. 8 shows a state in which positive voltage is applied according to a channel erasing method. The drain D and source S are opened, and the control gate CG is set to 0 V. The high voltage Vpp is applied to the P well equivalent to a channel. In channel erasing, a triple-well structure shown in FIG. 8 is adopted because positive bias is applied to the channel.

FIG. 9 shows a state in which a positive voltage is applied according to the source erasing method. The drain D is opened, and then the control gate CG is set to 0 V. The high voltage Vpp is applied to the source S. The substrate is opened or set to 0 V.

FIG. 10 shows a state in which a negative voltage is applied according to the channel erasing method. The drain D and source S are opened, and the control gate CG is set to a negative voltage $V_{BB}$. A positive voltage Vcc is applied to the p well equivalent to a channel. $V_{BB}$–Vcc is applied between the control gate CG and channel.

FIG. 11 shows a state in which negative voltage is applied according to the source erasing method. The drain D is opened, and then the control gate CG is set to the negative voltage $V_{BB}$. The source S is set to the positive voltage Vcc.

In erasing a flash memory, whichever is adopted; channel erasing or source erasing, voltage applied between the control gate CG and channel or source S greatly affects the erasing. For stable erasing, the voltage to be applied between the control gate and the channel or source must be held constant irrelevant of the fluctuation in external power supply. A memory for a portable device is one of currently conceivable application fields for a flash memory. This kind of portable equipment use batteries as a power supply. When employed for portable equipment, a flash memory is therefore subjected to a voltage fluctuation in an external power supply. Under these circumstances, there is an increasing demand for an erasing method for a flash memory that permits stable erasing irrelevant of a fluctuations in an external power supply, and for a flash memory that can be erased according to the erasing method.

DISCLOSURE OF THE INVENTION

The present invention attempts to solve the aforesaid problems, and has the following objects:

(1) To speed up an erasing operation including a pre-erase writing operation;

to enable stable erasing for a specified period of time.

For attaining the object, a flash memory based on the present invention, which performs channel erasing or source erasing by applying a negative voltage to a control gate, includes a voltage restriction means for restricting the negative voltage to be applied to the control gate so that the negative voltage will be a constant value relative to the voltage of a channel or source, or two voltage restriction means for restricting the negative voltage to be applied to the control gate and the voltage to be applied to the source so that the voltages will be a constant value relative to a common reference voltage.

In the flash memory based on the present invention, the voltage between a control gate and a channel or source is held constant all the time, so errors in erasing time will be diminished.

BRIEF DESCRIPTION OF THE DRAWINGS

FIG. 4 shows the conditions for writing; FIG. 5 shows the conditions for reading; FIG. 6 shows the conditions for erasing; FIG. 7 shows the conditions for erasing based on negative-voltage application;

BEST MODE FOR CARRYING OUT THE INVENTION

Figure 1:
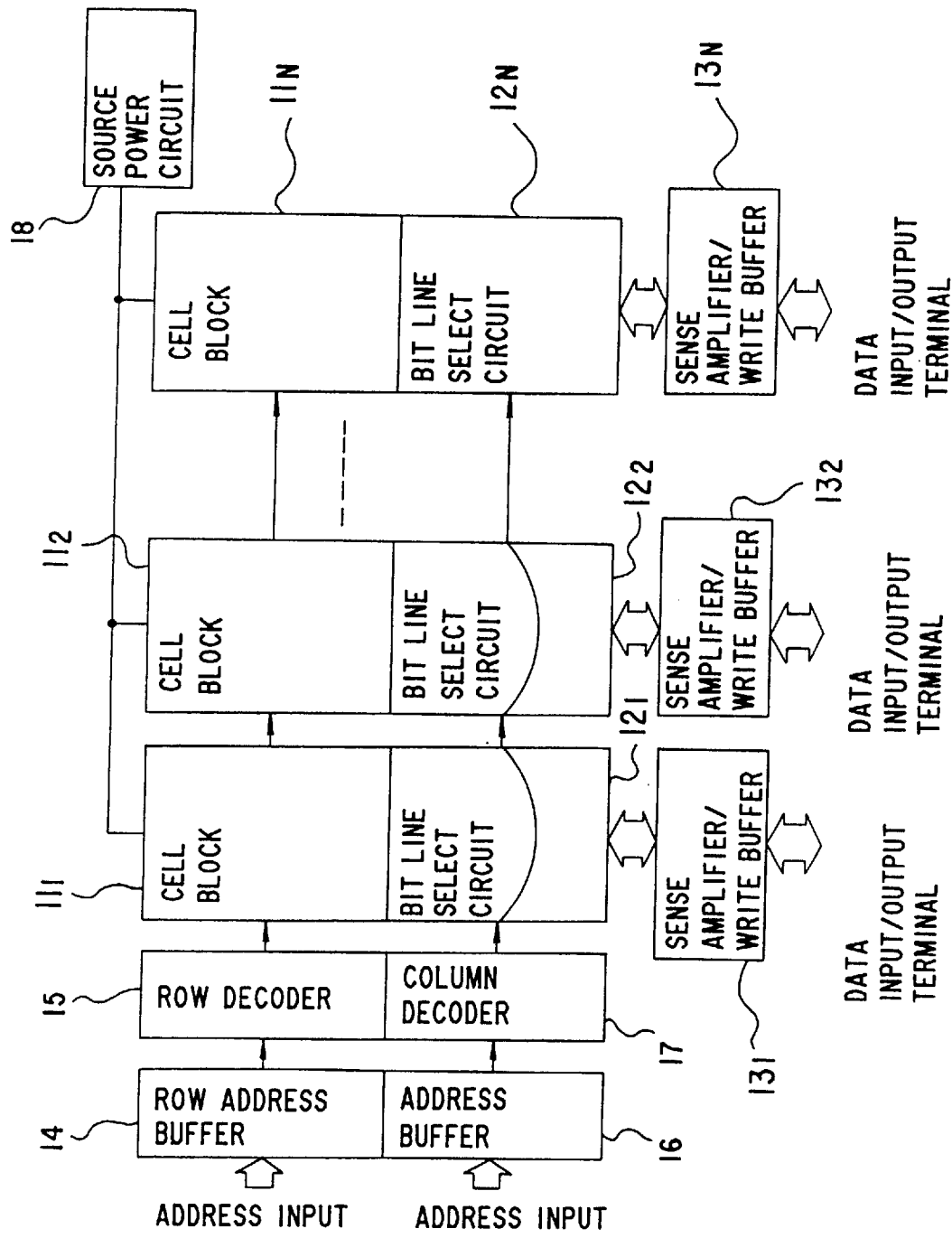
FIG. 1 shows an overall configuration of a flash memory in which the present invention is implemented.
Figure 2:
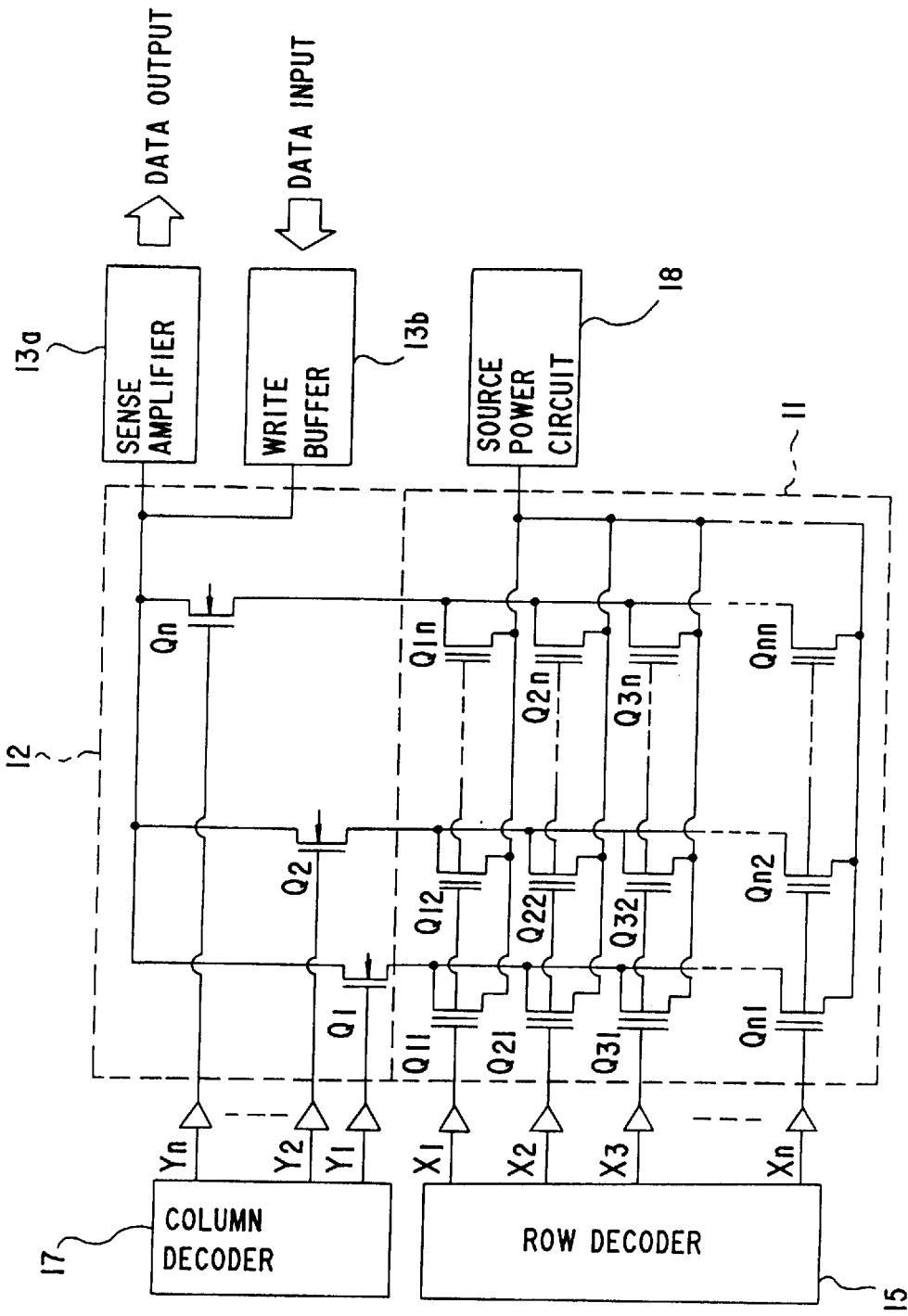
FIG. 2 is a circuit diagram showing a major section of FIG. 1.
Figure 3:
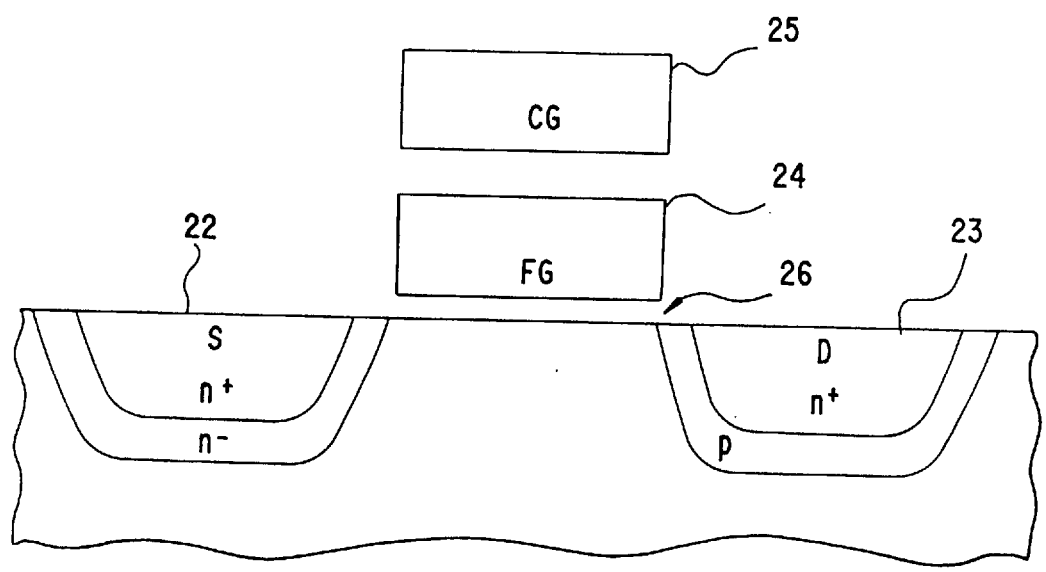
FIG. 3 shows a structure of a memory cell.
Figure 4:
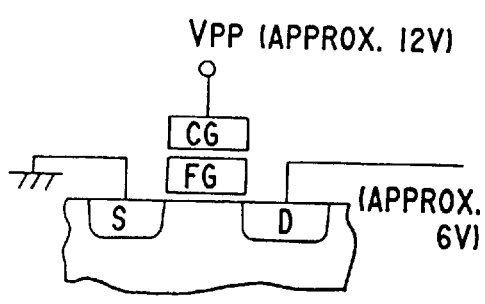
FIGS. 4 to 7 are explanatory diagrams for methods of reading, writing, and erasing a flash memory.
Figure 5:
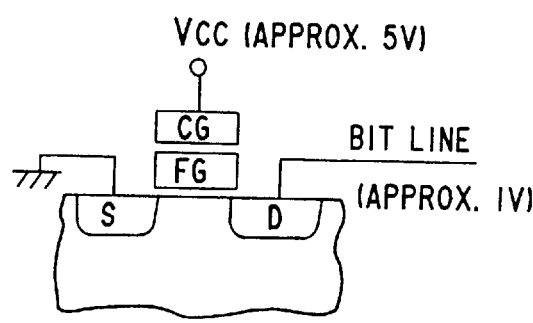
Figure 6:
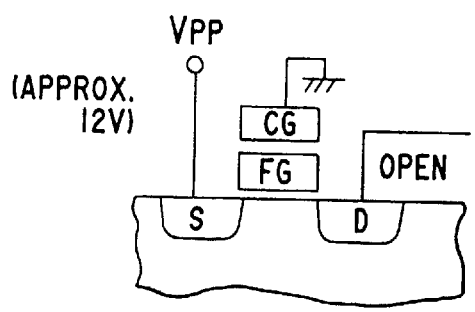
Figure 7:
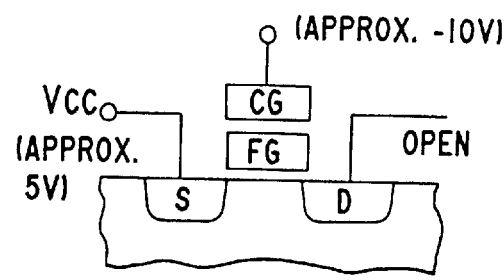
Figure 8:
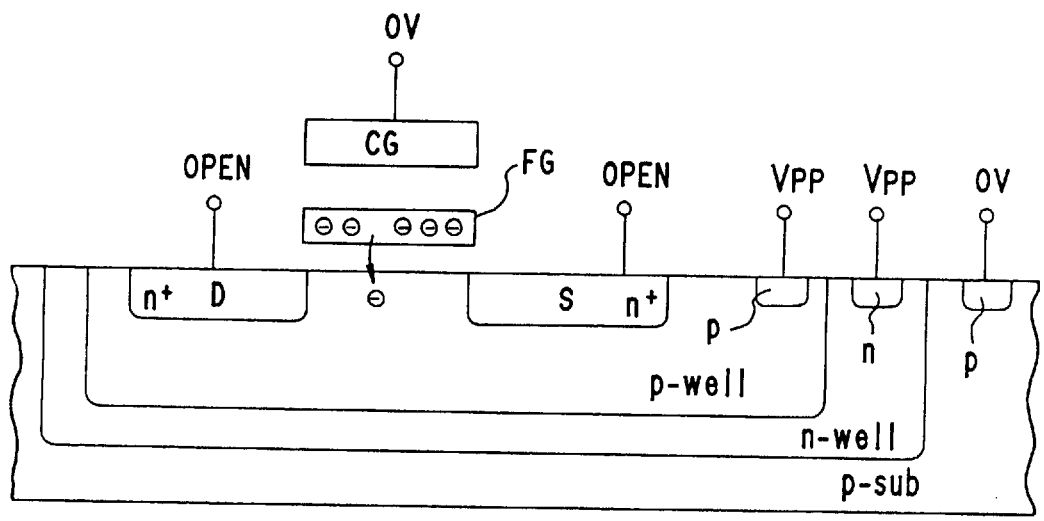
FIG. 8 is an explanatory diagram for channel erasing based on high-voltage application.
Figure 9:
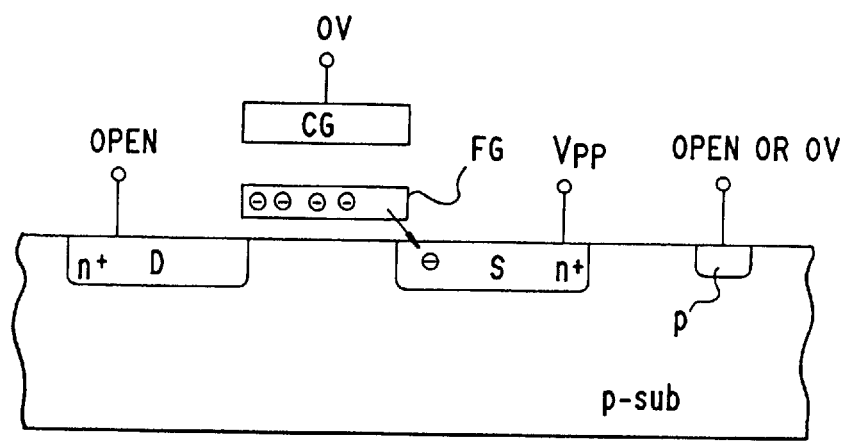
FIG. 9 is an explanatory diagram for source erasing based on high-voltage application.
Figure 10:
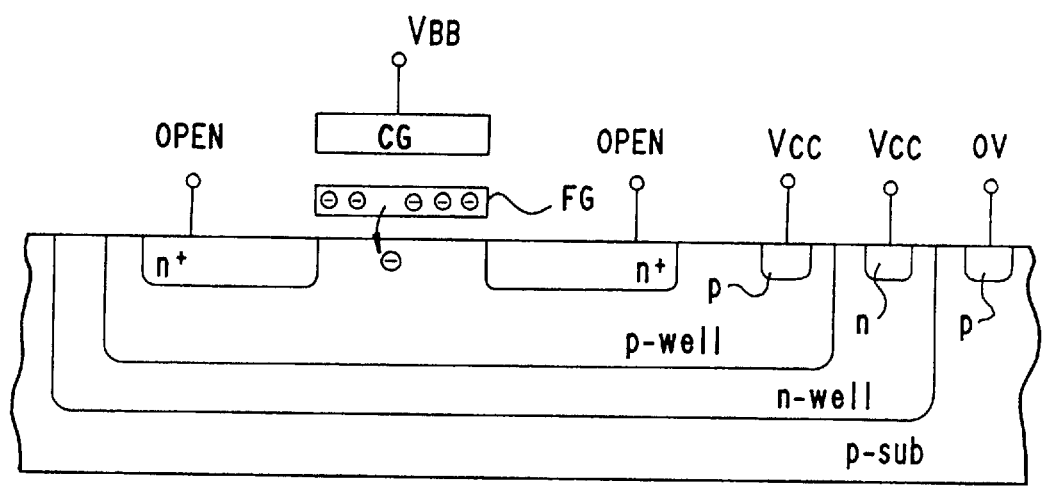
FIG. 10 is an explanatory diagram for channel erasing based on negative-voltage application.
Figure 11:
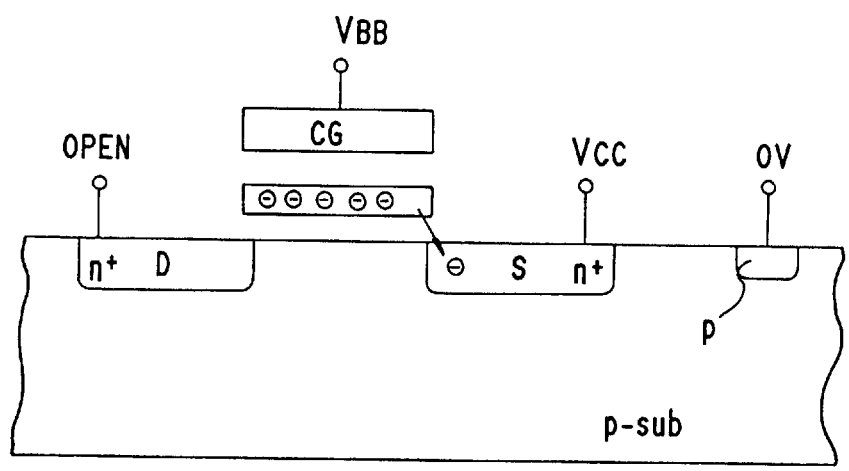
FIG. 11 is an explanatory diagram for source erasing based on negative-voltage application.
Figure 12:
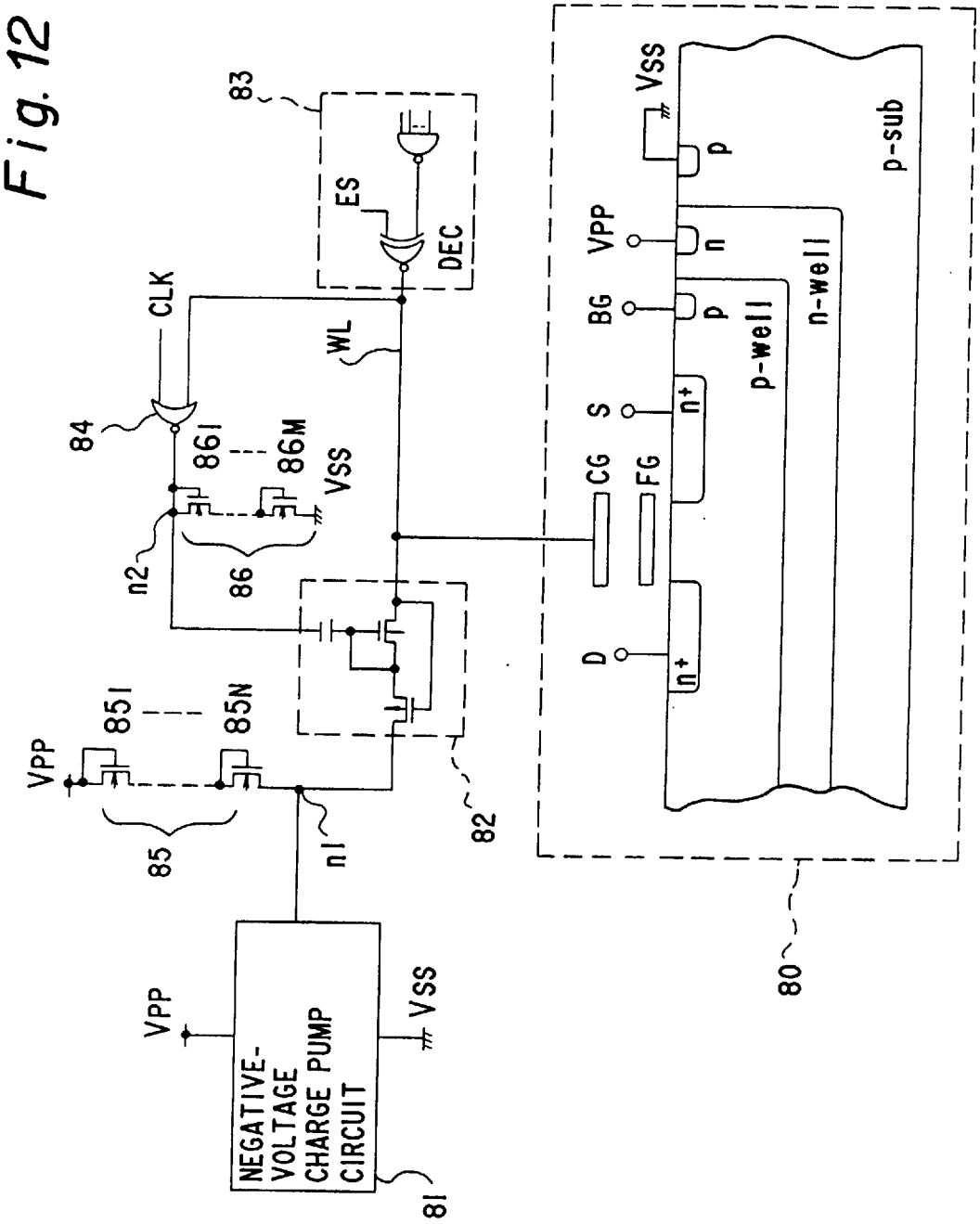
FIG. 12 shows a circuitry of the first embodiment.

FIG. 12 shows a configuration of the first embodiment, including a memory cell, a row decoder for feeding an access signal to a word line connected to a control gate CG of the memory cell, and a circuit for applying a negative voltage.

In FIG. 12, reference numeral 81 denotes a negative-voltage charge pump circuit; 82 denotes a negative voltage bias circuit; 83 denotes a decoder; 80 denotes a cell transistor; 85 and 86 denote MOS diode arrays each consisting of n-channel enhancement field-effect transistors $85_1$ to $85_N$ or $86_1$ to $86_M$; n1 and n2 denote nodes; 84 denotes a NOR gate; WL denotes a word line; D denotes a drain; S denotes a source; BG denotes a well contact; CG denotes a control gate; FG denotes a floating gate; CLK denotes a clock signal; ES denotes an erase select signal; Vpp denotes an external supply voltage; and Vss denotes a ground voltage.

For reading, the erase select signal ES is held low and the clock signal CLK is held high. In this state, the decoder 83 outputs a high signal when the word line WL is selected and a low signal when the word line WL is unselected. When the word line WL is low, the NOR gate 84 can receive the clock signal CLK. The clock signal CLK is, however, held high. The negative voltage bias circuit 82 therefore does not operate. A negative voltage $V_{BB}$ generated by the negative voltage charge pump circuit 81 will therefore not be applied to the word line WL.

For erasing, the erase select signal ES is driven high and the clock signal CLK is supplied. In this state, the decoder 83 outputs a low signal when the word line WL is selected and a high signal when the word line WL is unselected. When the word line WL is low, the NOR gate 84 can receive the clock signal CLK and the negative bias circuit 82 operates. The negative voltage $V_{BB}$ generated by the negative voltage charge pump circuit 81 is then applied to the word line WL. In the meantime, the drain D and source S of the memory cell 80 are open, and the voltage Vpp is applied to the well contact BG. When data has been written in the memory cell 80, electrons are passed through the floating gate FG to the channel due to the tunnel effect. Erasing is thus carried out.

The nodes n1 and n2 are clamped at a specified voltage by the MOS diode arrays that are the transistor arrays 85 and 86.

As mentioned above, in this embodiment, it is the row decoder 83 that applies the high voltage Vpp and positive voltage Vcc to a selected word line WL during writing or reading and applies a zero voltage Vss to unselected word lines WL. Negative voltage is applied by the negative voltage charge pump circuit 81. The control for applying negative voltage to a selected word line alone is extended by the row decoder 83. The row decoder 83 has a logic reversing function for providing an output whose logic is reversed between erasing and reading or erasing.

The negative voltage charge pump circuit 81 generates and outputs a negative voltage during normal operation or negative voltage application. The output voltage is restricted to a specified value by the transistor arrays connected between the negative voltage charge pump circuit 81 and the high voltage source Vpp.

The negative voltage bias circuit MVB will be described later. The detailed description is omitted there. With the input of the clock signal CLK, the output voltage of the negative voltage charge pump circuit 81 is placed on a word line.

A decrease of Vpp by a V will be discussed next.

The potential difference between Vpp and n1 is held at $Vpp-V_{BB}$ by the MOS diode array 85 that is a transistor array. If Vpp decreases by a V, the n1 voltage becomes:

$V_{BB}$−a The voltage between the control gate CG and channel in the memory cell 80 is held at:
Vpp−VBB
Next, an increase by a V of Vpp will be discussed.
If Vpp increases by a V, the n1 voltage becomes:
$V_{BB}$+a
The voltage between the control gate CG and channel in the memory cell 80 is then held at:
Vpp−VBB As mentioned above, even if the external voltage Vpp varies, the voltage between the control gate CG and channel is held constant all the time, so stable erasing characteristics are ensured.

In the foregoing first embodiment, the output voltage of the negative voltage charge pump circuit 81 is restricted to a specified value relating to the high voltage source Vpp, which is applied to the p well, by the transistor array. A constant voltage can thus be applied. In contrast, in the second embodiment to be described next, a negative voltage $V_{BB}$ applied to the control gate CG and a positive voltage Vcc applied to the p well are restricted to a ground (zero) voltage Vss. The potential difference between the negative voltage and positive voltage is thus held constant.

Figure 13:
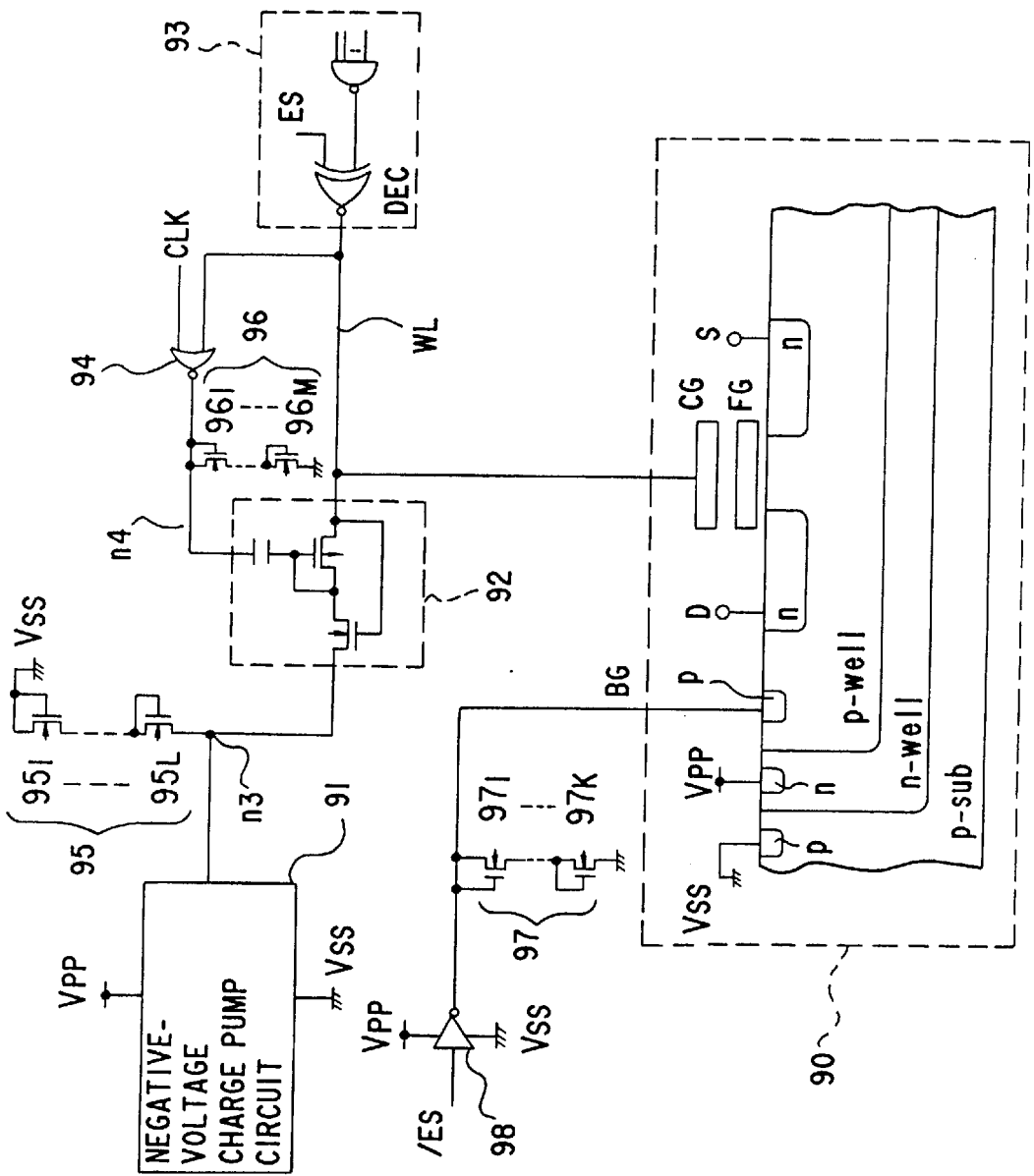
FIG. 13 shows a circuitry of the second embodiment.

FIG. 13 shows a configuration of the second embodiment. What differs from the circuitry in FIG. 12 is that the output of an inverter for generating voltage to be applied to the p well is restricted by a transistor array 97 and held constant relative to a ground voltage Vss, and that the output of a negative voltage charge pump 91 is restricted by a transistor array 95 and held constant relative the ground voltage Vss.

A fluctuation in Vpp will now be discussed.

The voltage between n3 and Vss or a well contact BG and Vss is held constant by a MOS diode array that is a transistor array 95 or a transistor array 97. Vss denotes a ground voltage, which therefore will not be affected by a fluctuation in Vpp. Irrelevant of the fluctuation in Vpp, a constant voltage is always supplied to a control gate CG and the well contact BG. The voltage between the control gate CG and channel is always held constant.

Despite a fluctuation in external voltage Vpp, the voltage between the control gate CG and channel is held constant. Stable erasing characteristics are ensured.

Figure 14:
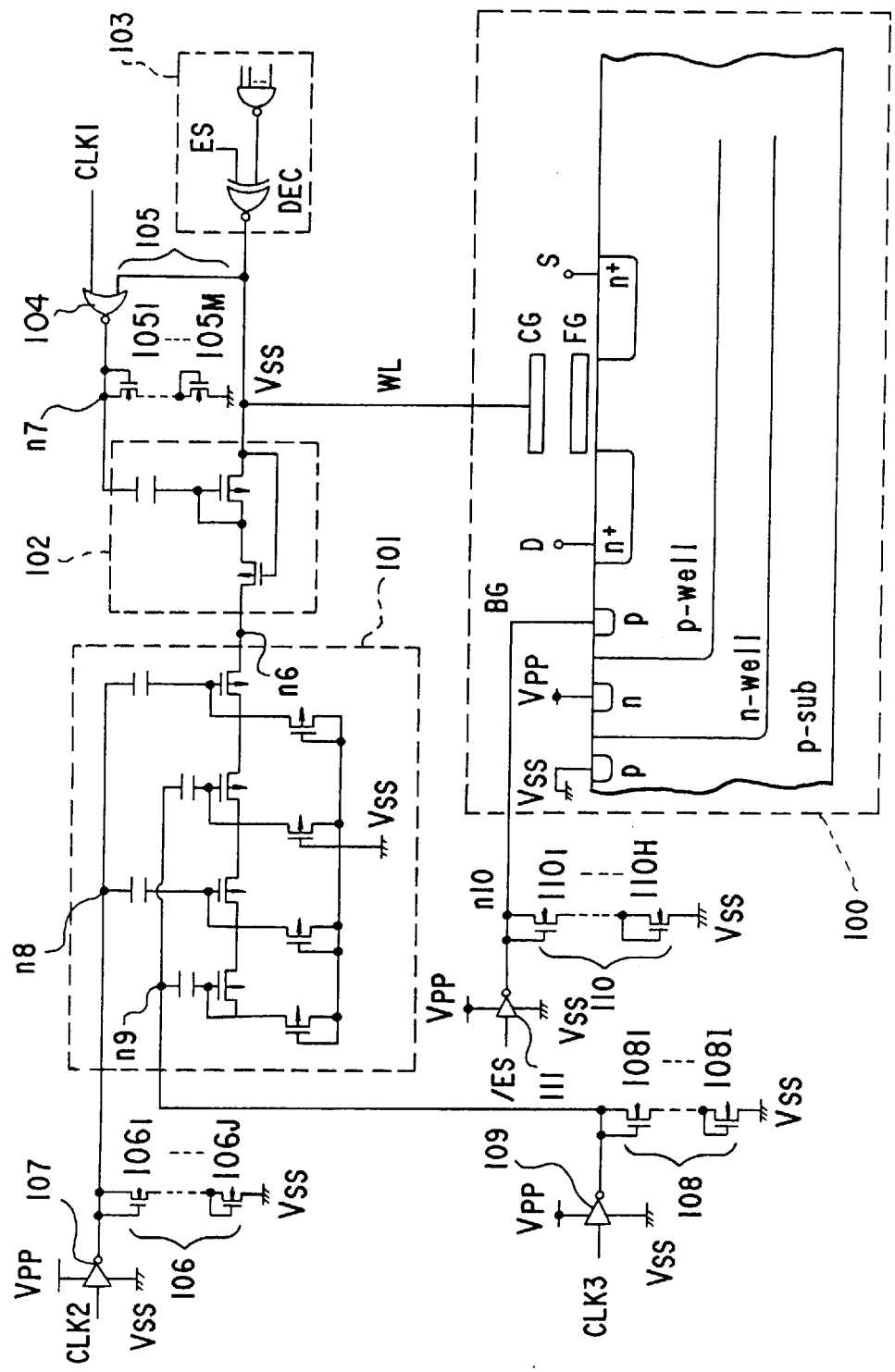
FIG. 14 shows a circuitry of the third embodiment.

FIG. 14 shows the third embodiment of a channel erasing method.

In FIG. 14, reference numeral 101 denotes a negative voltage charge pump circuit; 102 denotes a negative voltage bias circuit; 103 denotes a decoder; 107, 109, and 111 denote inverters; 100 denotes a cell transistor; 105, 106, 108, and 110 are n-channel enhancement field-effect transistor arrays; n6 to n10 denote nodes; WL denotes a word line; D denotes a drain; S denotes a source; BG denotes a well contact; CLK1 to CLK3 denote clock signals; ES denotes an erase select signal; /ES denotes an erase power switching signal; Vpp denotes an external supply voltage; and Vss denotes a ground voltage.

Next, the operations of the foregoing circuitry will be described.

For reading, the erase select signal ES is held low, the erase power switching signal /ES is held high, and the clock signals CLK1 to CLK3 are held high. The well contact BG is biased with Vss by the inverter 111. The decoder 103 outputs a high signal when the word line WL is selected, and a low signal when the word line WL is unselected. When WL is low, the NOR gate 104 can receive the clock signal CLK1. The clock signal CLK1 is held high. The negative voltage bias circuit 102 therefore does not operate. Since the clock signals CLK2 and CLK3 are also held high, the negative voltage charge pump circuit 101 does not generate $V_{BB}$. Negative voltage is therefore not applied to WL.

For erasing, the erase select signal ES is driven high and the erase power switching signal /ES is driven low. Clock signals are fed to the clocks CLK1 to CLK3. The clock signals CLK2 and CLK3 are mutually 180° out of phase. The decoder 103 outputs a low signal when the word line WL is selected, and a high signal when the word line WL is unselected. When WL is low, the NOR gate 104 can receive the clock signal CLK1. The negative voltage bias circuit 102 operates and applies $V_{BB}$ generated by the negative voltage charge pump circuit 101 to the word line WL. At this time, the source S and drain D of the cell transistor 100 are open and the well contact BG is provided with high voltage by the inverter 111. If data has been written in the cell transistor 100, electrons are passed through the control gate CG to the channel due to the tunnel effect. Erasing is thus achieved.

The n6 to n10 and well contact BG are clamped at certain voltages with Vss as a reference voltage by the transistor arrays 105, 106, 108, and 110.

A fluctuation in Vpp will now be discussed.

The value of a voltage $V_{BB}$ generated by the negative voltage charge pump circuit 101 is determined by the amplitude of a signal fed to the negative voltage charge pump circuit 101, the coupling coefficient, and the threshold voltage of a transistor. What is critical about a product is the amplitude of an input signal. In this embodiment, however, since the input terminals n8 and n9 of the negative voltage charge pump circuit 101 are clamped at constant voltages with Vss as a reference voltage, the input terminals n8 and n9 are free from the influence of a fluctuation in Vpp. The output voltage $V_{BB}$ of the negative voltage charge pump circuit 101 is held constant irrelevant of the fluctuation in Vpp. The voltage applied to the well contact BG is also clamped with Vss as a reference voltage, which therefore is constant irrelevant of the fluctuation in Vpp. Even if Vpp fluctuates, the voltage between the control gate CG and channel is held constant.

As mentioned above, even if the external voltage Vpp fluctuates, the voltage between the control gate CG and channel is held constant, so stable erasing characteristics are ensured.

The aforesaid embodiments provide channel erasing methods in which the voltage applied between a control gate and a channel is held constant in order to ensure stable erasing. Even in source erasing, stable erasing is assured by restricting applied voltage in the same manner.

Figure 15:
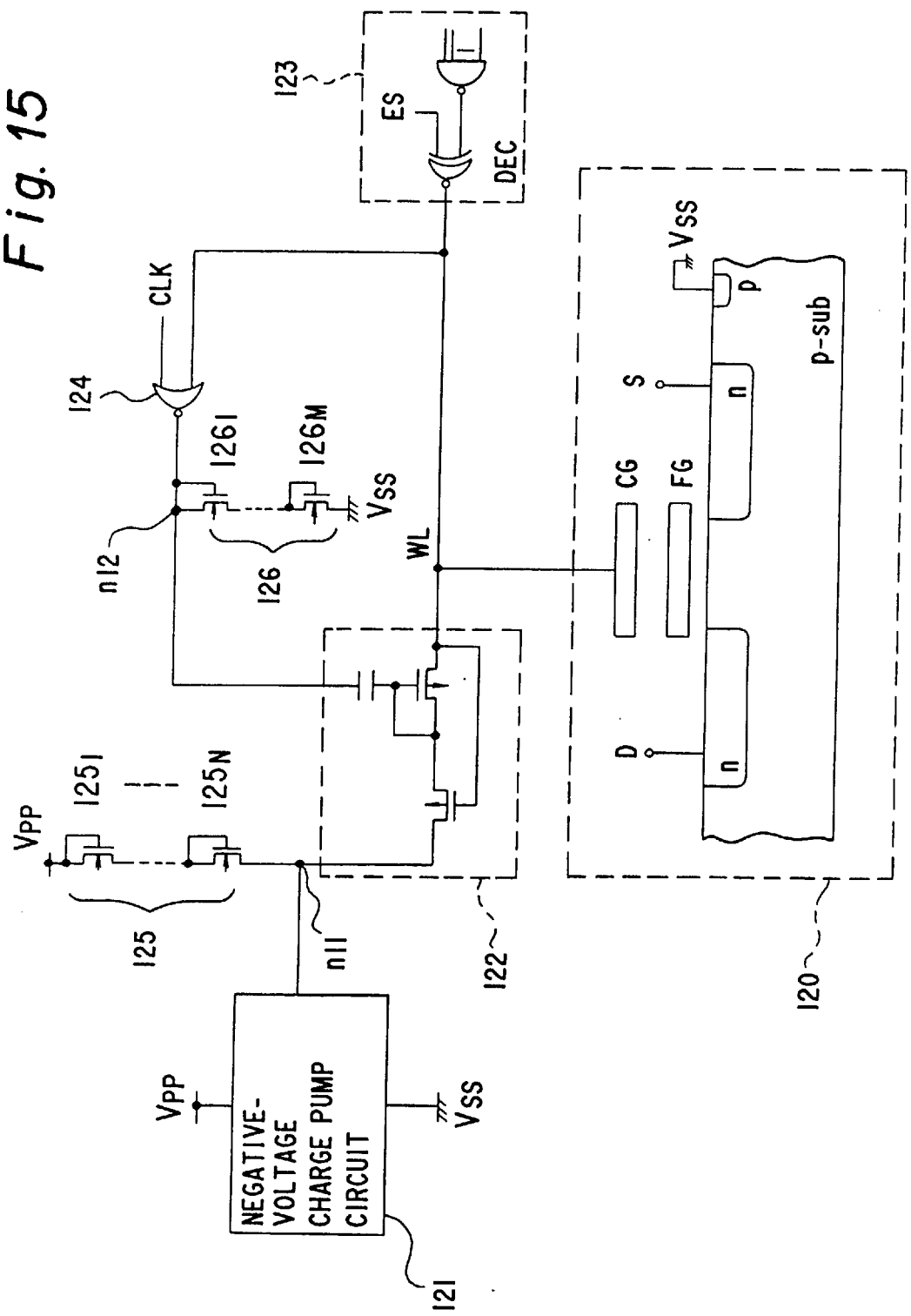
FIG. 15 shows a circuitry of the fourth embodiment.
Figure 16:
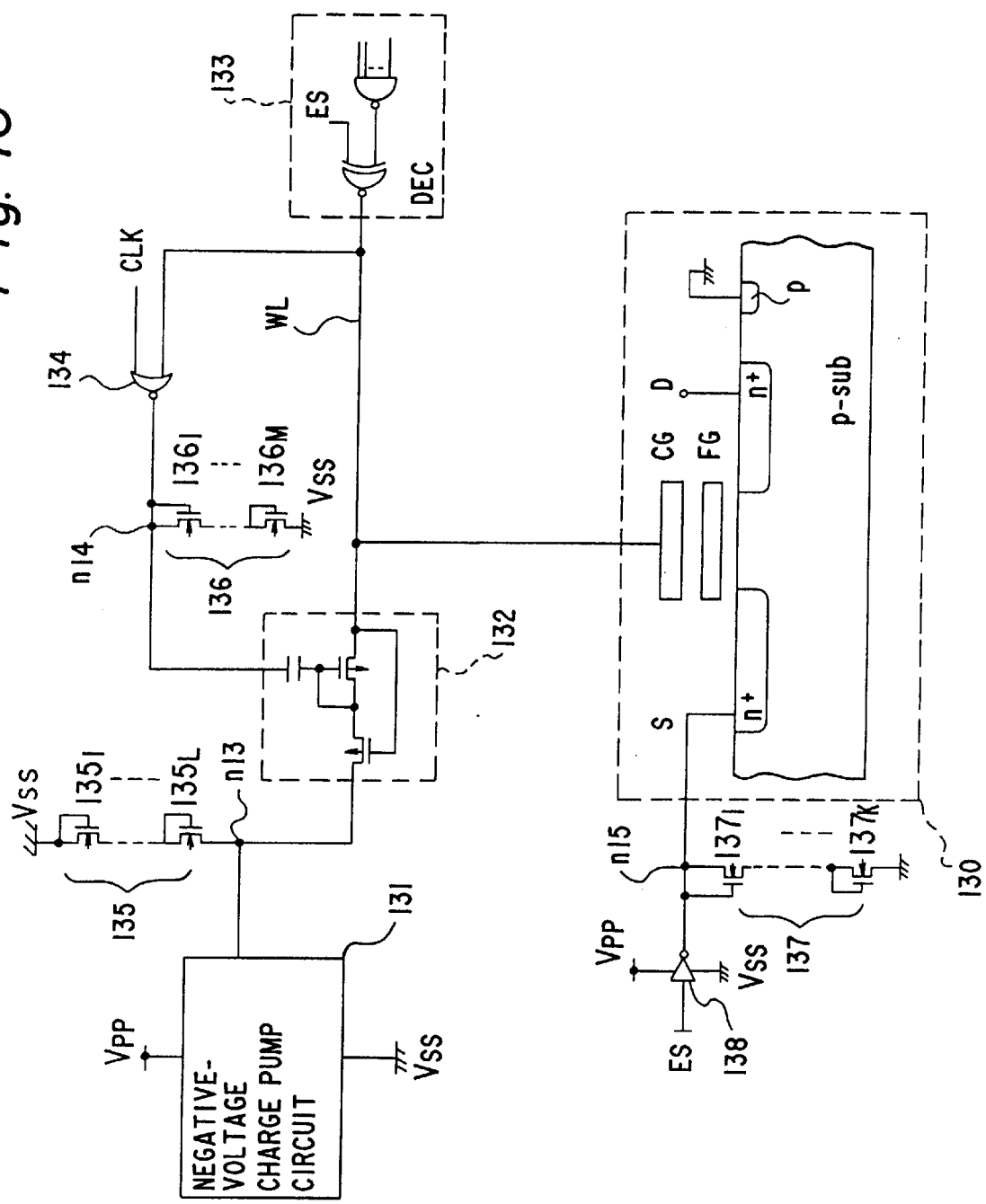
FIG. 16 shows a circuitry of the fifth embodiment.
Figure 17:
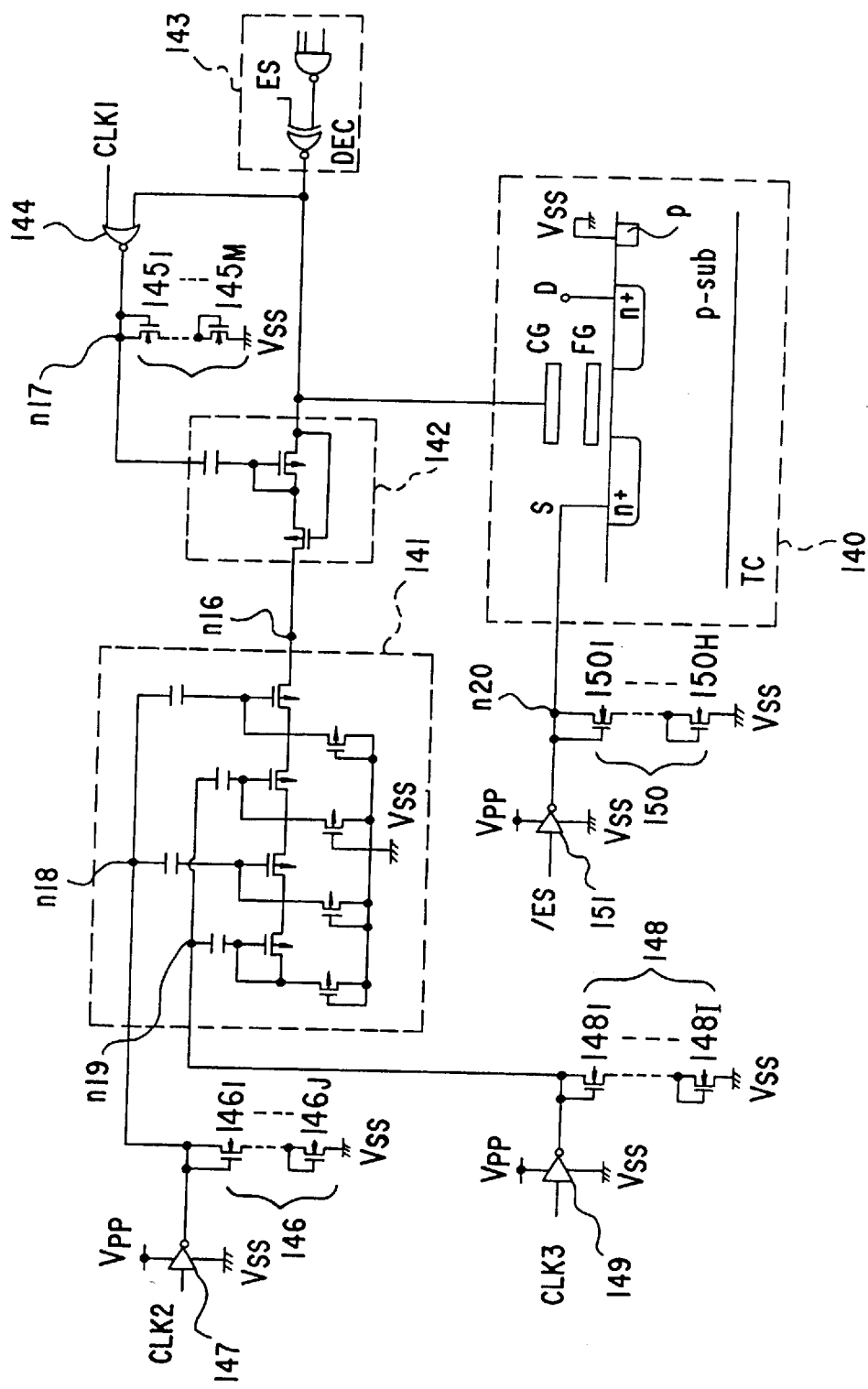
FIG. 17 shows a circuitry of the sixth embodiment.

FIGS. 15 to 17 show the fourth to sixth embodiments permitting stable source erasing. Unlike the channel erasing shown in FIGS. 12 to 14, voltage to be applied to a p well is applied to a source S.

As described previously, in a flash memory based on the present invention, a simple row decoder applies negative voltage for erasing. The circuitry is therefore downsized and high integration is realized. Furthermore, stable erasing contributes to an improvement in reliability.

What is claimed is:

1. A flash memory including a plurality of transistor cells each including a drain, a substrate, wells, a control gate and a floating gate, each of a plurality of word lines is connected to said control gates of said plurality of transistor cells arranged in a row, each of a plurality of bit lines is connected to said drains of said plurality of transistor cells arranged in tandem, and data stored in said transistor cells connected to at least one bit line of the plurality of bit lines can be electrically erased concurrently, said flash memory comprising:

a substrate voltage source for generating voltage to be applied to said substrates or said wells;

a negative-voltage source for generating negative voltage to be applied to said control gates, and that removes charge from said floating gates by applying voltage, which is negative with respect to the voltage in said substrates or wells, to said control gates;

a substrate voltage restriction means, connected between said substrate voltage source and reference voltage, for restricting the voltage generated by said substrate voltage source so that the voltage will be a first specified value in reference to said reference voltage; and a negative voltage restriction means, connected between said reference voltage and said negative voltage source, for restricting the negative voltage generated by said negative-voltage source so that the negative voltage will be a second specified value in reference to said reference voltage.

2. A flash memory including a plurality of transistor cells each including a source, a drain, a substrate, wells, a control gate and a floating gate, each of a plurality of word lines is connected to said control gates of said plurality of transistor cells arranged in a row, each of a plurality of bit lines is connected to said drains of said plurality of transistor cells arranged in tandem, and data stored in said transistor cells connected to at least one bit line of the plurality of bit lines can be electrically erased concurrently, said flash memory comprising:

a source voltage source for generating voltage to be applied to said sources;

a negative-voltage source for generating negative voltage to be applied to said control gates, and that removes charges from said floating gates by applying the negative voltage, which is negative with respect to the voltage at said sources, to said control gates;

a source voltage restriction means, connected between said source voltage source and a reference voltage, for restricting the voltage generated by said source voltage source so that the voltage will be a first specified value in reference to said reference voltage; and a negative-voltage restriction means, connected between said reference voltage and said negative voltage source, for restricting the negative voltage generated by said negative-voltage source so that the negative voltage will be a second specified value in reference to said reference voltage.

* * * * *